United States Patent
Jevtic

[19]

[11] Patent Number: 5,928,389
[45] Date of Patent: Jul. 27, 1999

[54] METHOD AND APPARATUS FOR PRIORITY BASED SCHEDULING OF WAFER PROCESSING WITHIN A MULTIPLE CHAMBER SEMICONDUCTOR WAFER PROCESSING TOOL

[75] Inventor: Dusan Jevtic, Santa Clara, Calif.

[73] Assignee: Applied Materials, Inc., Santa Clara, Calif.

[21] Appl. No.: 08/735,370

[22] Filed: Oct. 21, 1996

[51] Int. Cl.⁶ .............................. H01L 21/77; H01L 21/02
[52] U.S. Cl. .......................................... 29/25.01; 438/908
[58] Field of Search ........................ 29/25.01; 438/907, 438/908, FOR 437

[56] References Cited

U.S. PATENT DOCUMENTS

| | | |
|---|---|---|
| 4,715,921 | 12/1987 | Maher et al. . |
| 4,825,808 | 5/1989 | Takahashi et al. . |
| 5,024,570 | 6/1991 | Kiresko et al. . |
| 5,375,061 | 12/1994 | Hara et al. .............................. 364/468 |
| 5,402,350 | 3/1995 | Kline ...................................... 364/468 |

FOREIGN PATENT DOCUMENTS

| | | |
|---|---|---|
| 2-78243 | 3/1990 | Japan . |
| 2 296 818 | 7/1996 | United Kingdom . |

*Primary Examiner*—David Graybill
*Attorney, Agent, or Firm*—Thomason & Moser

[57] ABSTRACT

Apparatus and concomitant method for performing priority based scheduling of wafer processing within a multiple chamber semiconductor wafer processing system (cluster tool). The sequencer assigns priority values to the chambers in a cluster tool, then moves wafers from chamber to chamber in accordance with the assigned priorities. The sequencer is capable of determining the amount of time available before a priority move is to be performed and, if time is sufficient, the sequencer performs a non-priority move while waiting. The sequencer also dynamically varies assigned priorities depending upon the availability of chambers in the tool. Lastly, the sequencer prioritizes the chambers based upon the minimum time required for the robot to move the wafers in a particular stage.

18 Claims, 8 Drawing Sheets

METHOD AND APPARATUS FOR PRIORITY BASED SCHEDULING OF WAFER PROCESSING WITHIN A MULTIPLE CHAMBER SEMICONDUCTOR WAFER PROCESSING TOOL

BACKGROUND OF THE INVENTION

1. Field of the Invention

The present invention relates to a multiple chamber wafer processing system and, more particularly, to a method and apparatus for scheduling processing for a semiconductor wafer within a multiple chamber semiconductor wafer processing tool.

2. Description of the Background Art

Semiconductor wafers are processed to produce integrated circuits using a plurality of sequential process steps. These steps are performed using a plurality of process chambers. An assemblage of process chambers served by a wafer transport robot is known as a multiple chamber semiconductor wafer processing tool or cluster tool. FIG. 1 depicts a schematic diagram of an illustrative multiple chamber semiconductor wafer processing tool known as the Endura® System manufactured by Applied Materials, Inc. of Santa Clara, Calif.

The cluster tool 100 contains, for example, four process chambers 104, 106, 108, 110, a transfer chamber 112, a preclean chamber 114, a buffer chamber 116, a wafer orienter/degas chamber 118, a cooldown chamber 102, and a pair of loadlock chambers 120 and 122. Each chamber represents a different stage or phase of semiconductor wafer processing. The buffer chamber 116 is centrally located with respect to the loadlock chambers 120 and 122, the wafer orienter/degas chamber 118, the preclean chamber 114 and the cooldown chamber 102. To effectuate wafer transfer amongst these chambers, the buffer chamber 116 contains a first robotic transfer mechanism 124. The wafers 128 are typically carried from storage to the system in a plastic transport cassette 126 that is placed within one of the loadlock chambers 120 or 122. The robotic transport mechanism 124 transports the wafers 128, one at a time, from the cassette 126 to any of the three chambers 118, 102, or 114. Typically, a given wafer is first placed in the wafer orienter/degas chamber 118, then moved to the preclean chamber 114. The cooldown chamber 102 is generally not used until after the wafer is processed within the process chambers 104, 106, 108, 110. Individual wafers are carried upon a wafer transport blade 130 that is located at the distal end of the first robotic mechanism 124. The transport operation is controlled by a sequencer 136.

The transfer chamber 112 is surrounded by and has access to the four process chambers 104, 106, 108 and 110 as well as the preclean chamber 114 and the cooldown chamber 102. To effectuate transport of a wafer amongst the chambers, the transfer chamber 112 contains a second robotic transport mechanism 132. The mechanism 132 has a wafer transport blade 134 attached to its distal end for carrying the individual wafers. In operation, the wafer transport blade 134 of the second transport mechanism 132 retrieves a wafer from the preclean chamber 114 and carries that wafer to the first stage of processing, for example, a physical vapor deposition (PVD) stage within chamber 104. Once the wafer is processed and the PVD stage deposits material upon the wafer, the wafer can then be moved to a second stage of processing and soon.

Once processing is complete within the process chambers, the transport mechanism 132 moves the wafer from the process chamber and transports the wafer to the cooldown chamber 102. The wafer is then removed from the cooldown chamber using the first transport mechanism 124 within the buffer chamber 116. Lastly, the wafer is placed in the transport cassette 126 within the loadlock chamber 122.

More generally, a cluster tool contains n chambers, denoted by $C_1, C_2, \ldots, C_n$, one or more transfer chambers (robots), and one or more loadlocks 120 and 122. The exact layout is called the configuration. A wafer $W_a$ to be processed is taken from a loadlock, placed successively into various chambers $C_{i1}, C_{i2}, \ldots, C_{ik}$, respectively, and then returned to a loadlock. As such, the wafer's "trace" through the tool is $$LL_{1v2} \to C_{i1} \to C_{i2} \to \ldots \to C_{ik} \to LL_{1v2} \tag{1}$$

where wafer $W_a$ visits chambers $C_{i1}, C_{i2}, \ldots, C_{ik}$. The notation $C_{ij} \to C_{ij+1}$ above means that a wafer has to visit chamber $C_{ij+1}$ after visiting chamber $C_{ij}$. Note that a wafer's trace does not have to involve all chambers in the configuration; for example $$LL_{1v2} \to C_i \to LL_{1v2} \tag{2}$$

is a valid trace even though there may be n>1 chambers. Generally, it is assumed that chambers are visited by one wafer at a time. In (1) and (2), it is assumed that the cluster tool has two loadlocks; symbol v stands for logical OR. Usually a wafer is returned to the same position in the loadlock cassette that it was taken from. However, the following disclosure applies to any number of loadlocks and any number of chambers (including transfer chambers) where the wafer can be taken from one loadlock and returned to a different loadlock. a As seen from (1) and (2) above, a wafer's trace is the trajectory of a particular wafer through the cluster tool; that is, a trace is the order in which chambers are visited by a wafer (not necessarily $C_{i+1}$ after $C_i$). This should be distinguished from the term "processing sequence" which is the order of applying processes (recipes) to a wafer. If more than one chamber runs the same process (parallel chambers), a given processing sequence may be satisfied by several different traces. A processing sequence is known ahead of time and is a part of a computer program called a "sequencer" which schedules the movement of wafers through the cluster tool; describes processes to be applied to wafers while in chambers; describes processes a chamber is subjected to while in clean mode; describes conditions for the status change of a chamber (e.g. how many wafers or how much time before the clean process must be performed); and so on. An alternative term for a sequencer is a router.

A wafer which completes its processing sequence and is returned to the loadlock is said to be processed by the tool. Roughly speaking, a tool's throughput is the number of wafers processed by the tool per unit of time. That is, if the tool needs t seconds to process $n_t$ wafers, then $$S_t := \frac{n_t}{t} \tag{3}$$

is the tool's throughput measured in the interval [0,t].

There are many ways to improve the tool's throughput for a given processing sequence. However, one important improvement is to use efficient scheduling routines for a given processing sequence.

The optimization of scheduling involves the choice of criteria used in deciding when to transfer a wafer from one chamber into the next (and which wafers should be moved prior to that) given the trace. A routine which schedules the movement of wafers through the cluster tool (based on a given processing sequence) is referred to as "scheduling routine." The steady-state throughput of a tool under scheduling routine A will be denoted by S(A). For ease of notation, its dependence on a wafer's trace and a tool's parameters (e.g., chamber processing times and wafer transfer times) are disregarded.

If n>1 then, depending on a given processing sequence, one may consider a number of scheduling routines. The routine which maximizes the value of throughput is deemed "optimum" and the maximum attainable value of throughput is known as the tool's "capacity." That is, if A is the set of all possible scheduling algorithms for a given processing sequence, then A* is optimum if $$S(A^*) = \max\{S(A) | A \in A\} \tag{7}$$

Clearly, the tool's capacity $S(A^*)$ depends on a given processing sequence as well as on chamber and robot parameters within the processing sequence. The tool's capacity is denoted by $C_*$, where subscript* identifies the trace; its dependence on chamber and robot parameters are disregarded. The problem of finding good scheduling routines for a given processing sequence (especially, finding optimum routines where possible) is of considerable practical importance.

Recall that notation $C_i \rightarrow C_j$ means that a wafer has to visit chamber $C_j$ after visiting chamber $C_i$. Logical OR denotes the case in which a wafer visits exactly one from a given subset of chambers. For example, $$C_i \longrightarrow (C_{r1} v C_{r2} v \ldots v C_{rk}) \tag{8}$$

describes a subtrace where after visiting chamber $C_i$ a wafer will visit exactly one of the k chambers from the subset $\{C_{r1}, C_{r2}, \ldots, C_{rk}\}$. There are four basic traces commonly used in cluster-tool wafer processing. In the order presented below, these are: serial, parallel, mixed and knotted trace.

For an n-chamber cluster tool with chambers $C_1, C_2, \ldots, C_n$ the trace $$LL_{1v2} \longrightarrow C_1 \longrightarrow C_2 \longrightarrow \ldots \longrightarrow C_n \longrightarrow LL_{1v2} \tag{9}$$

is referred to as a pure serial or just serial trace. A serial trace is used in a situation in which a wafer undergoes n-step processing (in n different chambers), where step k requires a successful completion of the previous step k−1, for k=2, 3, . . . ,n.

With respect to the number of steps, the opposite of trace representation (9) is 1-step processing; its trace, $$LL_{1v2} \longrightarrow C_k \longrightarrow LL_{1v2}. \tag{10}$$

k=1,2, . . . ,n, is referred to as a pure parallel or just parallel trace. If all chambers run the same process, then trace representation (10) can be written as $$LL_{1v2} \longrightarrow (C_1 v C_2 v \ldots v C_n) \longrightarrow LL_{1v2} \tag{11}$$

A serial-parallel or parallel-serial combination of traces is referred to as a mixed trace. An example of a mixed trace is:

$$LL_{1v2} \longrightarrow C_1 \longrightarrow (C_2^{(a)} v C_2^{(b)}) \longrightarrow \tag{12}$$
$$(C_3^{(a)} v C_3^{(b)}) \longrightarrow C_4 \longrightarrow LL_{1v2}.$$

Mixed traces are usually derived from serial traces by duplicating chambers which have long processing times.

A chamber whose name appears more than once in a wafer's trace is referred to as a knot-chamber. The simplest example of a trace with one knot-chamber is the trace $$LL_{1v2} \longrightarrow C_1 \longrightarrow \ldots \longrightarrow C_i \longrightarrow \ldots \longrightarrow \tag{13}$$
$$C_k \longrightarrow C_i \longrightarrow C_{k+1} \longrightarrow \ldots \longrightarrow C_n \longrightarrow LL_{1v2}.$$

Trace (13) is also known as having a processing loop. A situation in which chambers $C_1, C_2, \ldots, C_k$ have wafers in them is called a deadlock. For example, in $LL_{1v2} \rightarrow C_1 \rightarrow C_2 \rightarrow C_3 \rightarrow C_2 \rightarrow LL_{1v2}$, chamber $C_2$ is a knot-chamber. Note that if $C_1, C_2$ and $C_3$ are occupied by wafers $w_1, w_2$ and $w_3$, respectively, then $w_3$ cannot move into $C_2$ and $w_2$ cannot move into $C_3$; thus we have a deadlock (assuming no preemption by dual blade robot or the use of a buffer chamber).

Even though different wafers within a configuration may have different traces, a scheduling routine always pertains to a given processing sequence. A preferable scheduling routine maintains the tool's throughput very near to its capacity. Even if it were possible to use the same routine in each of the above traces, the overhead involved in verifying conditions which do not exist in a particular trace may be considerable.

The following are four scheduling routines that presently find use in the prior art.

In a push-and-wait routine, the reference trace is a serial trace. Specifically, the robot first moves a wafer $w_i$ from the $LL_{1v2}$ to chamber $C_1$ and waits at $C_1$ until $w_i$ is processed and so on until finally it moves $w_i$ from $C_n$ to the $LL_{1v2}$. The robot then takes the next wafer $w_{i+1}$ from the $LL_{1v2}$ and repeats the above sequence of n so-called "move and wait until processed" steps.

If n=1, then a push-and-wait routine is the only routine possible. The push-and-wait routine is the simplest possible routine and can be used in parallel as well as in mixed traces. Since it does not schedule concurrent chamber activities at all, it is effective only if robot waits at each of the n chambers for a very short time.

In a pull-through wafer packing routine, the reference trace is a serial trace (9). Let r be the highest chamber index such that chamber $C_{r+1}$ is empty and chambers $C_1, C_2, \ldots, C_r$ contain wafers $w_1, w_2, \ldots, w_r$ respectively. (If r=n, then $C_{r+1}$ is the $LL_{1v2}$.) A single blade robot starts by moving $w_r$ from $C_r$ into $C_{r+1}$ (if r=n, $w_n$ moves from $C_n$ into the $LL_{1v2}$). The robot then goes to $C_{r-1}$, waits if necessary, and moves $w_{r-2}$ from $C_{r-1}$ and so on until finally the robot gets a new wafer $w_0$ from the $LL_{1 \vee} 2$ and places wafer $w_o$ into $C_1$. The robot then goes into the starting position which is either at $C_{r+1}$ (f r<n−1) or at $C_n$.

This routine is known as a wafer packing routine because it packs as many wafers into chambers as possible, thus maximizing the concurrent chamber processing activities. The pull-through packing routine starts with the highest-numbered chamber and moves (pulls) wafers, successively placing each wafer into the next higher-numbered chamber.

In a push-through wafer packing routine, the reference trace is a serial trace (9). Let r be the highest index such that chamber $C_{r+1}$ is empty and chambers $C_1, C_2, \ldots, C_r$ contain wafers $w_1, w_2, \ldots, w_r$, respectively. A dual blade robot starts by retrieving a new wafer $w_0$ from the $LL_{1 \vee} 2$. It then moves to $C_1$, waits if necessary, moves $w_1$ from $C_1$ and places $w_0$ into $C_1$. Next, the robot moves to $C_2$, waits if necessary, removes $w_2$ from $C_2$ and puts $w_1$ (which was on the blade) into $C_2$ and so on until finally the robot places $w_r$ into $C_{r+1}$ (if r=n, it puts $w_n$ into the $LL_{1 \vee} 2$). The robot then retrieves another wafer from the $LL_{1 \vee} 2$ and repeats the above steps.

Clearly, pull-through and push-through wafer packing routines are two versions of the same packing routine. The push-through routine is so named because it starts with the lowest-numbered chamber and moves (pushes) wafers, successively replacing each wafer with a wafer from a lower-numbered chamber. This requires a dual (multi) blade robot which results in a somewhat higher throughput (because of a shorter wafer exchange time) than is possible with a pull-through wafer packing routine using a single blade robot.

In a reactive scheduling routine, the reference trace is a parallel trace (10). When the tool is finished processing a wafer $w_i$ the sequencer calls the robot to chamber $C_i$. After completing current activities (if any), the robot moves to $C_i$ removes $w_i$ from $C_i$ and places $s_{w_i}$ into the $LL_{1 \vee} 2$, then removes a new wafer $w_{i+1}$ from the $LL_{1 \vee} 2$ and places it into $C_i$. The robot is then ready to service the next chamber call.

A cycle comprised of moving a processed wafer $w_i$ from $C_i$ to the $LL_{1 \vee} 2$ and placing $w_{i+1}$ into $C_i$ is called a wafer exchange. Consequently, upon receiving a call to go to $C_i$, the robot finishes a current wafer exchange (if any) and then moves to $C_i$ to accomplish the wafer exchange. This routine is known as a reactive scheduling routine because the robot reacts to chamber calls from the sequencer.

In an anticipated scheduling routine, the reference trace is a parallel trace (10). After completion of wafer exchange in chamber $C_j$, a counter I (that corresponds to $C_i$) is reset. The counter has a preset limit $T_i$ seconds, $$t_i := T_i - \max_r T_{r,i} \qquad (14)$$

where $T_i$ is the processing time of $C_i$ and $T_{r,i}$ is the time a robot needs to reach home position at $C_i$ from the home position at $C_r$. After $t_i$ seconds, the robot completes a current wafer exchange (if any) and then moves toward $C_i$ to accomplish an anticipated wafer exchange in $C_i$.

This routine is known as an anticipated scheduling routine because the robot anticipates the instant of a chamber call and pre-positions itself to perform a wafer exchange. In both reactive and anticipated scheduling, chamber calls are stored (queued) and are serviced according to the routine (usually in the order received); simultaneous calls are resolved by external priorities.

Note that when applied to pure parallel traces waferpacking algorithms may induce unnecessary wait times and, consequently, the tool's throughput may suffer (especially when $\max_i T_i \gg \min_i T_i$). Also note that reactive and anticipated scheduling are inadequate for pure serial traces. For example, if chamber $C_i$ requires a wafer exchange, the transfer chamber first has to verify the status of $C_{i-1}$ and $C_{i+1}$ (empty or not); if a wafer exchange is not possible, the call has to be stored (and reactivated later) resulting in unnecessary additional program complexity, CPU activity, and memory allocation.

Therefore, a need exists in the art for improved scheduling routines to increase throughput of a cluster tool that can be used in a variety of trace formats.

SUMMARY OF THE INVENTION

The disadvantages heretofore associated with the prior art are overcome by an invention of a method and apparatus for performing priority based scheduling of wafer processing within a multiple chamber semiconductor wafer processing system (a cluster tool). The first embodiment of the invention uses a wafer packing technique to achieve the priority based scheduling. This first embodiment entails assigning the highest priority to a robot move which moves a wafer from a wafer cassette (loadlock) and places the wafer into the first stage of a wafer trace. Subsequent priorities are assigned to the various stages of the process. Typically, the loadlock has the highest priority when the wafer is to be removed, while the lowest priority is assigned to the loadlock that is to receive the processed wafer. For each move of the robot, the method scans the available stages looking for an empty stage with the highest priority. The highest priority stage is filled first and then the robot will move to the lower priority stages to fill any empty stages therein. The scanning process is accomplished by scanning a data structure that defines the trace for the processes that are about to be completed.

The second embodiment of the invention is a gamma tolerant wafer packing technique. Since each stage contains a process with a known time required to complete the process, the method computes how long any one chamber will be used to process a wafer. In the foregoing wafer packing technique, if a high priority chamber was filled and processing a wafer, the robot may wait until that wafer is completed processing, then remove the processed wafer and replace it with a new wafer. To improve efficiency, rather than have the robot wait for completion of the process, the robot moves another wafer while awaiting the high priority wafer to be completed. The method decides which wafer to move, based on certain timing requirements. Specifically, the method computes a value that equals the rotation time for the robot to move to another position and return, plus the wait time anticipated at the other chamber. This value is referred to as $T_{meanwhile}$. In addition, the method uses a variable denoted $T_{remains}$ as the time remaining for the process in the high priority chamber to be complete. Dividing $T_{remains}$ by $T_{meanwhile}$ provides an indicia of whether or not the robot should proceed to the next chamber or await the present chamber's completion. The quotient value is compared to a threshold denoted γ. If the variable does not exceed the value of γ, the method will cause the robot to wait at the high priority chamber until the process is complete. Otherwise, the robot proceeds to the other chamber and moves that wafer. Consequently, the process throughput of this system is substantially improved over a conventional wafer packing technique.

The third embodiment of the invention recalculates the priorities assigned to the chambers prior to scanning the chambers for the next appropriate robot move.

The fourth embodiment of the invention combines aspects of the second and third embodiments.

The fifth embodiment of the invention takes into account the time necessary for the robot to move from one point to another when assigning priorities to the chambers.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

As discussed above, FIG. 1 depicts a schematic diagram of a conventional multiple chamber semiconductor wafer processing tool. The depicted cluster tool 100 is controlled by a sequencer that executes the priority based scheduling routines of the present invention.

Figure 1:
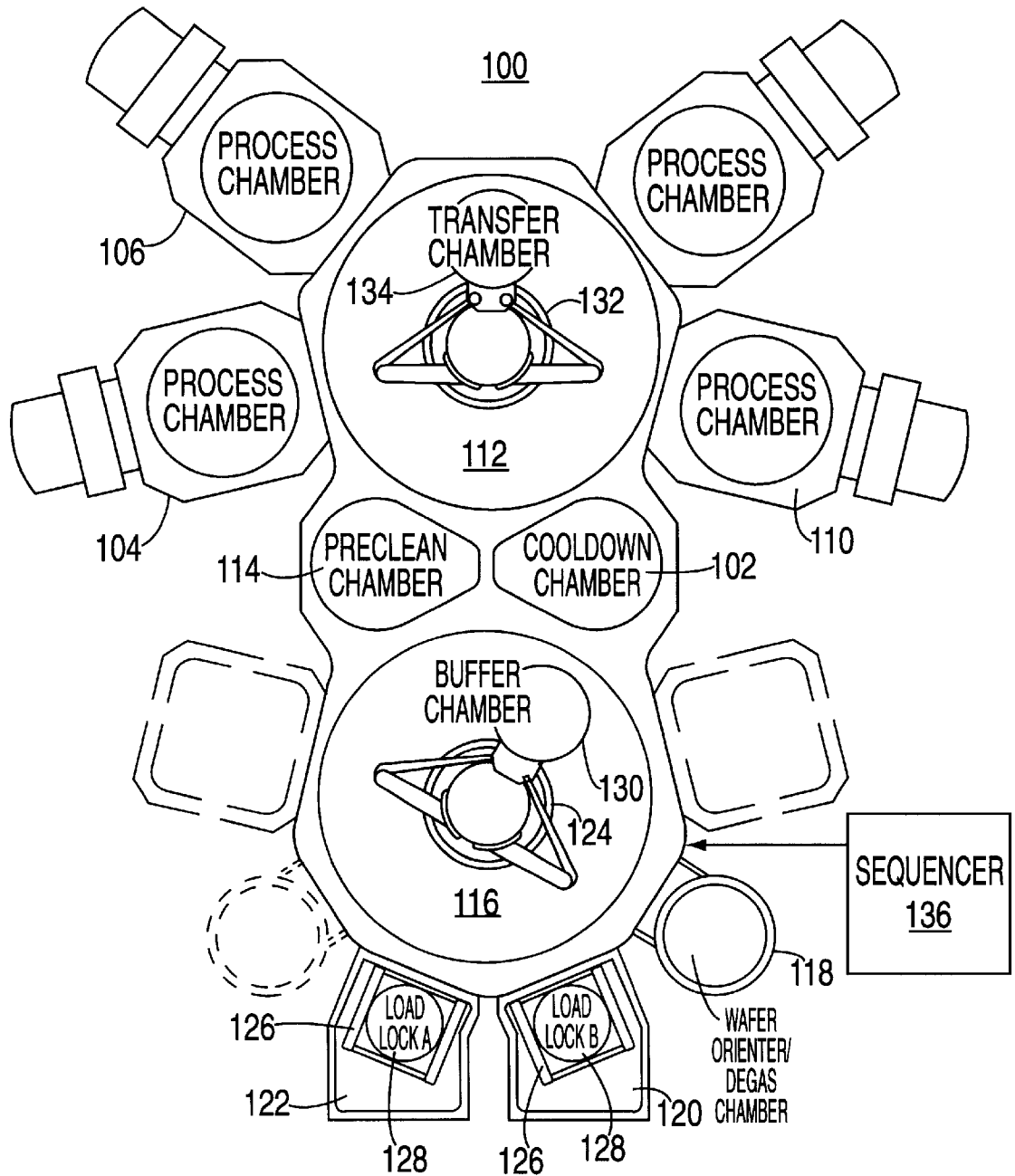
FIG. 1 depicts a schematic diagram of a multiple chamber semiconductor wafer processing tool being controlled by sequencer.
Figure 2:
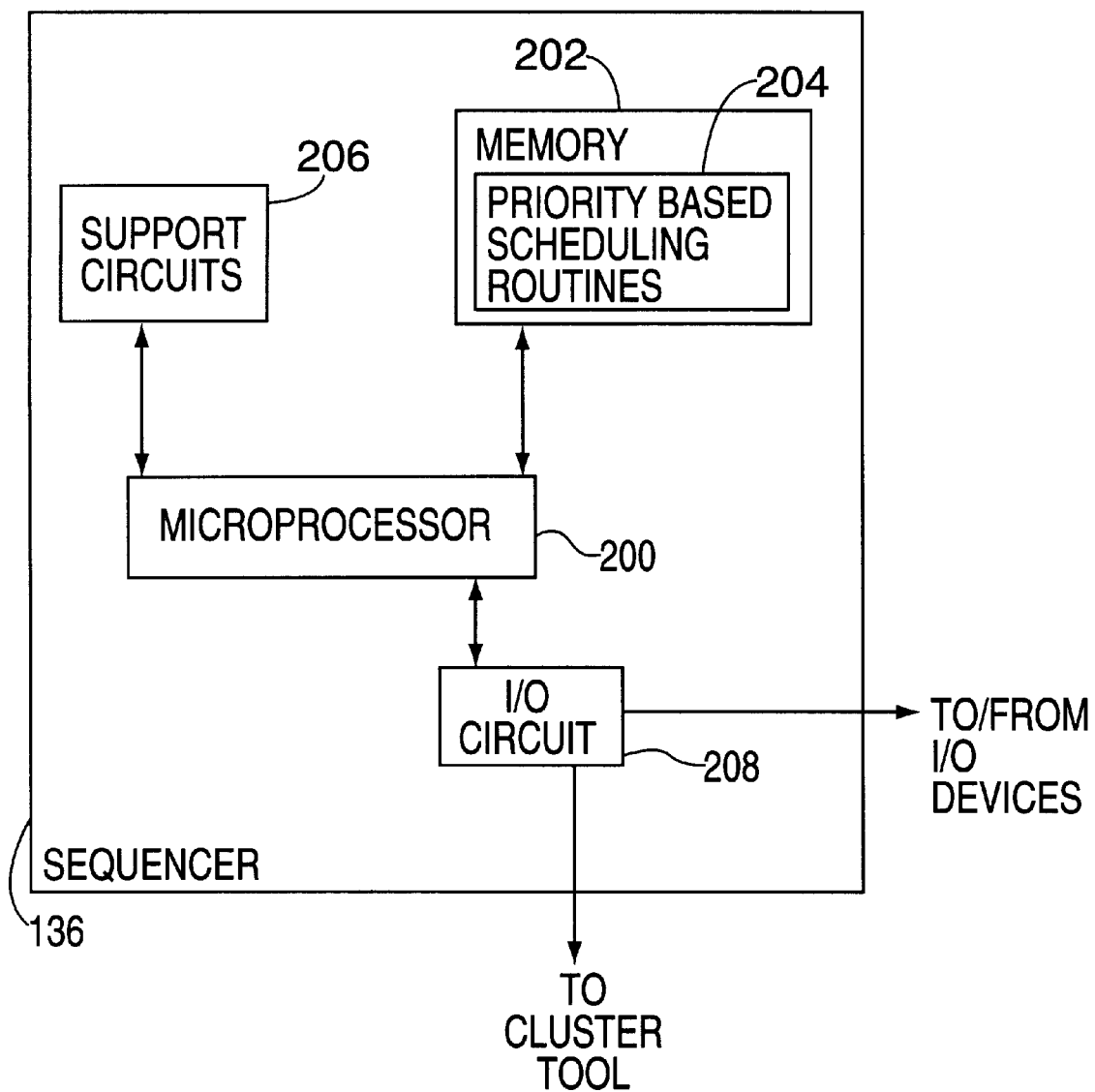
FIG. 2 depicts a block diagram of a sequencer that performs operative steps in accordance with the present invention.

FIG. 2 depicts a block diagram of a sequencer 136 that operates to control the processing performed by the cluster tool 100 of FIG. 1. The sequencer 136 contains a microprocessor 200 as well as memory 202 for storing the routines of the present invention, and support circuitry 206 such as power supplies, clock circuits, cache, and the like. The sequencer also contains input/output circuitry 208 that forms an interface between conventional input/output (I/O) devices such as a keyboard, mouse, and display as well as an interface to the cluster tool. The sequencer 136 is a general purpose computer that is programmed to perform the sequencing and scheduling operations in accordance with the present invention. The basic operation of the cluster tool as well as the sequencer is defined above. The software implementations 204 of the methods of the present invention are stored within memory 202 and executed by the microprocessor 200 to facilitate control of at least one robot wafer transport within the cluster tool.

The invention is based on the observation that chambers in the cluster tool have:

different temporal positions with respect to a given processing sequence;

different processing time durations;

different spatial positions with respect to any given position of the robot arm.

As such, the wafer transfers from chamber to chamber should be handled with different priorities. The inventive routines which use these observations are called Wafer Packing, SPT (Scheduling based on Process Times), and Robot Bound (RB) scheduling. Each is described below.

I. Wafer Packing Routine

Let stages $S_1, S_2, \ldots, S_N$ correspond to processing sequence $P_1, P_2, \ldots, P_N$, respectively. Wafer packing assigns the highest priority to a robot move which removes a wafer from the cassette and places the wafer into the first stage of a wafer's trace (where the wafer undergoes process $P_1$). By induction, wafer packing gives priorities N, N−1, ..., 1 to stages $S_1, S_2, \ldots, S_N$, respectively, where higher number indicates higher priority. The loadlock has the highest priority (N+1) when the wafer is to be taken from the cassette. The routine describing priority based wafer packing is given below; its corresponding flow diagram is described with respect to FIG. 3.

The routine performs the following five basic steps:

1. Initialize: S←0 and go to Step 2.
2. S←S+1. If S=N+1, go to Step 5; else, go to Step 3.
3. Scan the stage S for an empty chamber. If there are no empty chambers, go to Step 2; else go to Step 4.
4. Identify the empty chamber in state S. Let this chamber be chamber $C_x$. Scan the stage S−1 for the first wafer which is ready to leave the stage S−1. Let it be wafer W in chamber $C_y$. Position the robot at $C_y$, wait if necessary, and move W from $C_y$ to its target chamber $C_x$. Update a data structure defining the state of the cluster tool and go to Step 1.
5. Position the robot at a chamber whose wafer is to leave the stage N first. After the wafer is moved from stage N to a loadlock, update the data structure and go to Step 1.

The variable S=0,1,...,N+1 represents the stage number. In Step 4, if S=1, there is always a wafer ready to leave stage 0 (stage 0 is the loadlock); in Step 3, if S=N+1, there is always an empty space to move a wafer into (since stage N+1 is the loadlock again).

The phrase "scan the stage S" in steps 3 and 4 above means to scan a data structure describing stage S. In procedural programming such a data structure may be a linked list or an array of records, where each record describes a chamber. This data structure is further described with reference to FIG. 4 below. In object oriented programming, a chamber may be an object from a given class and a stage would be an instance of its super class.

Denote by T the length of a cassette stay in the tool. Assuming that the pump and vent time of a cassette are overlapped with processing time of other cassettes, then, by Little's formula, it follows that $T=S^{-1}M$, where M is the number of wafers in the cassette and S is the steady-state throughput. Thus, the length of a cassette stay in the tool is minimized when the throughput is maximized and hence a scheduling routine which minimizes the length of a cassette's stay in the tool is optimum. Note that wafer packing routine attempts exactly that by trying to move a new wafer from the cassette into the cluster as soon as it is possible (i.e., by assigning the highest priority to that move).

Also note that wafer packing algorithm is "static" in the sense that it does not alter priorities in the case when chambers are not available (say, due to a chamber cleaning process). If (for whatever reason) a chamber is not available, that chamber will simply not be selected as the target chamber until it becomes ready to accept a wafer.

Figure 3:
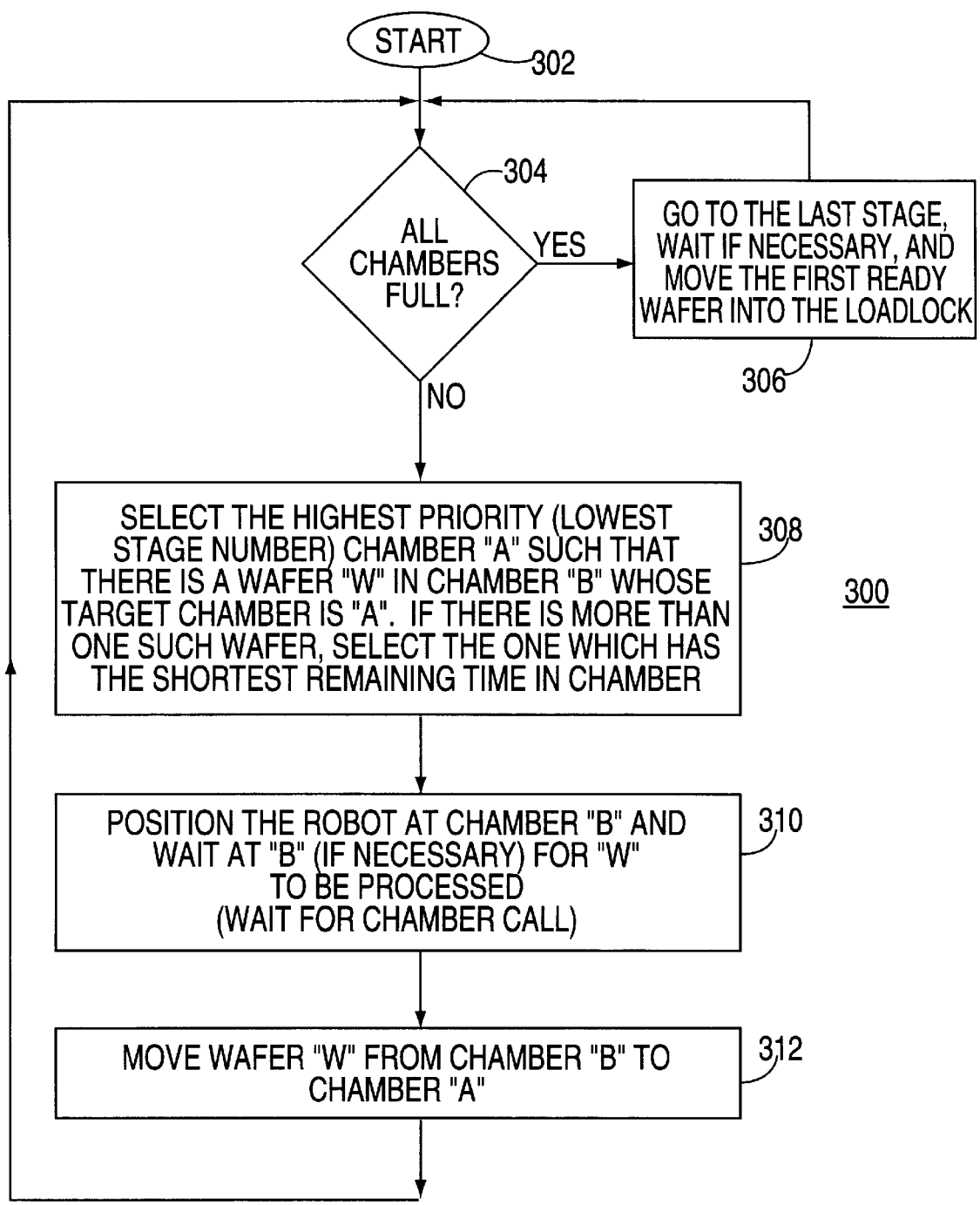
FIG. 3 depicts a flow diagram of a software implementation of a first embodiment of the present invention.

FIG. 3 depicts a flow diagram of a priority based wafer packing routine 300 that forms the first embodiment of the invention. To implement this routine, the chambers are preassigned priority values equivalent to the stage number for the chamber. Thus, the loadlock containing unprocessed wafers has the highest priority, the first stage chamber has the next highest, and so on down to the loadlock for the processed wafers which has a priority of zero. The routine 300 starts at step 302 and proceeds to step 304. At step 304, the routine queries whether all the chambers are full. If the query is affirmatively answered, the routine proceeds to step 306 wherein the robot is instructed to move to the last stage and move the first available wafer into the loadlock. The robot will wait at that stage if necessary.

Once the first available wafer is moved into the load lock, the routine returns to the query step 304. If the query is negatively answered, the routine proceeds from step 304 to step 308. At step 308 the routine selects the highest priority chamber (e.g., chamber A) such that there is a wafer W in chamber B whose target chamber is chamber A. However, if there is more than one such wafer, the routine selects the wafer to be moved which has the shortest remaining time in its present chamber. At step 310, the robot is positioned at chamber B to await wafer W to be completely processed therein. At step 312, the robot moves wafer W from chamber B to chamber A. Upon completion of the move, the routine returns to the query step 304.

Typically, the highest priority chamber is selected by scanning the stage. This entails monitoring the priority assigned to each chamber and locating the chamber with the highest priority. Generally, this scanning process is accomplished by scanning a data structure which contains information concerning the priority of each chamber.

Figure 4:
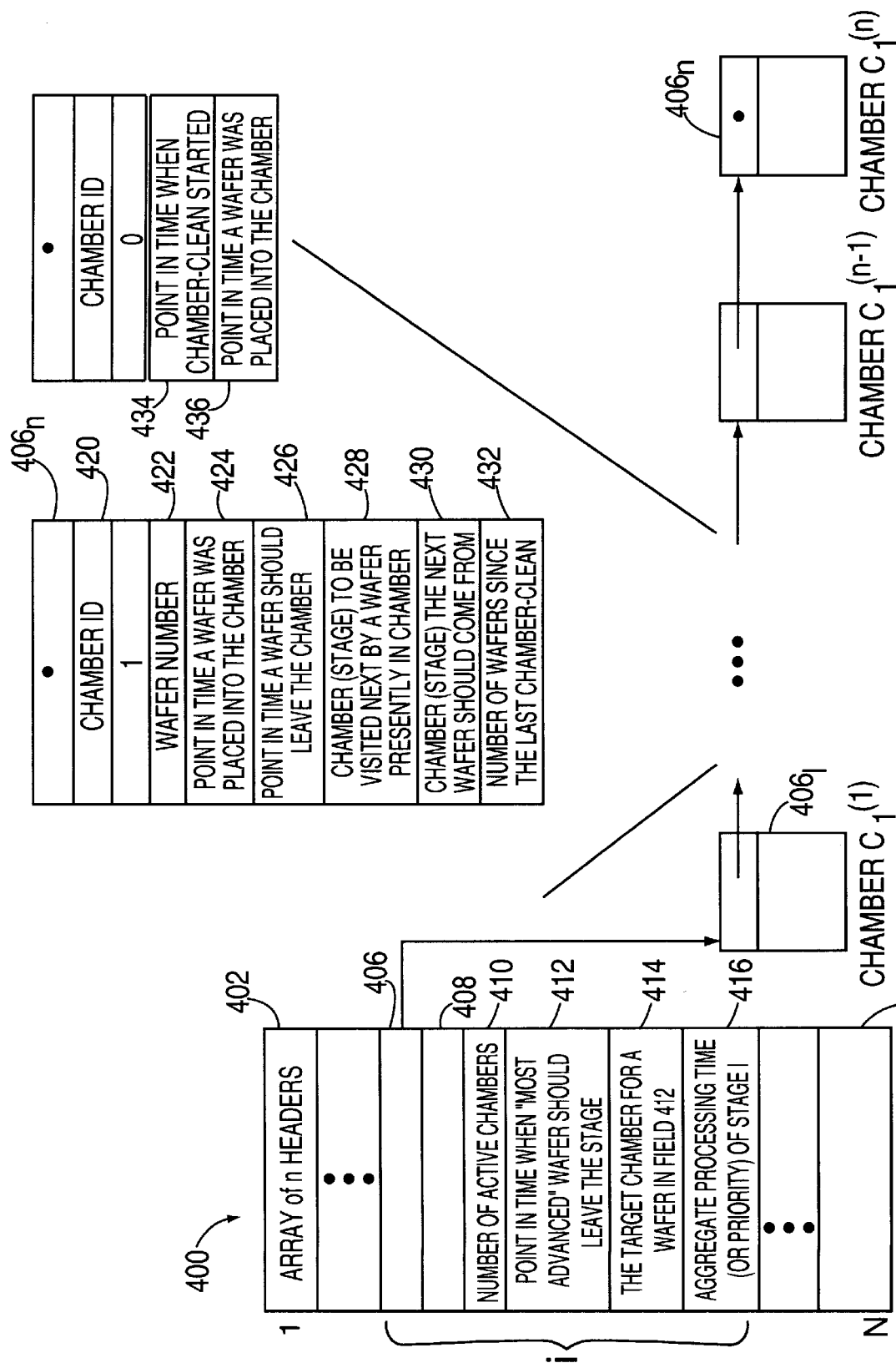
FIG. 4 depicts an illustrative data structure containing the priority information used by the present invention.

FIG. 4 depicts an illustrative data structure 400 that could be used to identify and characterize each chamber in a stage. The cluster tool operation is defined by a data structure 400 that contains information regarding the tool as a whole, its constituent chambers and the various process stages. The data structure 400 (a linked list) contains a plurality of records 402 that define the tool at each stage i of the process to be performed. Each record 402 contains an array of n headers 404, an array of n chamber records 406, an empty chamber field 408, an active chamber field 410, a "most advanced" wafer indicator field 414, target chamber field 414, and an aggregate processing time field 416. Each header briefly describes the process step to be accomplished by each chamber at the particular stage i.

Each record 406 that identifies an active chamber (i.e., a chamber that is not in a clean mode) contains a chamber identification field 420, a wafer number field 422, a wafer enter time field 424, a wafer exit time field 424, next chamber field 428, a next wafer field 430 and wafer count field 432. Each chamber in a clean mode is identified by a record containing a chamber ID field 420, a clean start time field 434, and a chamber ready time field 436. Each chamber's identification number is stored in field 420. The wafer number field 422 contains the wafer identification number of the wafer that will be processed in this chamber during this particular stage i. The wafer enter time field 424 contains the time during the process that the wafer enters the chamber, while the wafer exit time field 426 contains the time at which the wafer will be removed from the chamber. The next chamber field contains the chamber identification number of the next chamber to be visited by the wafer. The next wafer field 430 contains the chamber identification number of the chamber from which the next wafer to be processed presently resides. Field 432 contains a count of the number of wafers that have been processed by the chamber since the last cleaning cycle. Generally, when the wafer count attains a predefined value, the sequencer takes the chamber "off-line" for cleaning. When a chamber cleaning cycle is begun, the chamber is identified by a record containing fields 434 and 436. Field 434 contains the time at which the clean cycle began. The chamber ready time field 436 contains the time that the chamber will again be ready to process wafers after the clean cycle.

Each stage file 402 also indicates the number of empty chambers during stage i in field 408 and the number of active chambers in field 410. The "most advanced" wafer indicator field 412 contains the time at which the "most advanced" wafer should leave stage i. The target chamber field 414 contains the chamber to which the most advanced wafer is to visit in the next stage. Lastly, field 416 contains the aggregate processing time for stage i or the priority of stage i. Thus, by scanning this data structure associated with each stage of the process, the invention can quickly assess the status of any chamber and prioritize its next move to efficiently transport wafers from one chamber to another.

II. Gamma-Tolerant Wafer Packing Routine

When the wafer packing routine is applied to a pure serial trace, then in Step 4 above, the robot has to wait at a chamber until the wafer inside the chamber is processed because there is nothing else the robot can do. In mixed traces, it is possible for the robot to do another wafer transfer rather than to wait for a wafer W in stage S−1 to be processed. To facilitate such an improvement, the basic wafer packing routine is implemented as follows:

1. Initialize: S←0 and go to Step 2.
2. S←S+1. If S=N+1, go to Step 9; else, go to Step 3.
3. Scan the stage S for an empty chamber. If there are no empty chambers, go to Step 2; else, go to Step 4.
4. Identify the empty chamber in stage S. Let it be chamber A. Scan the stage for S−1 for the first wafer which is ready to leave stage S−1. Let it be wafer W in chamber B. Calculate the difference $$T_{remains} := T_{finish} - T_{now} - T_{robot},$$

where $T_{finish}$ is the anticipated time chamber B should finish processing wafer W, $T_{now}$ is the present time, and $T_{robot}$ is the time robot needs to reach B from its present position. If $T_{remains}$ is not positive, go to Step 5; else, go to Step 6.

5. Position the robot at chamber B and move wafer W from B to A. Update the data structure and go to Step 1.
6. Scan all stages, starting with stage 0 and applying 2 and 3 above, until a pair of chambers X and Y in stages t and t−1, respectively, is found so that X is empty and the time $$T_{menawhile} := Z_{robot} + T_{wait}$$

is minimum. $Z_{robot}$ is the rotation time from robot's present position to Y plus the wafer transfer time from Y to X while $T_{wait}$ is the anticipated waiting time at chamber Y. Go to Step 7.

7. If $T_{remains}/T_{meanwhile} < \gamma$, go to Step 5; else, go to Step 8.
8. Position the robot at chamber Y, wait if necessary, and move the wafer from chamber Y to chamber X. $T_{remains} \leftarrow T_{remains} - T_{meanwhile}$. If $T_{remains}$ is not positive, go to Step 5; else, go to Step 6.
9. Position the robot at a chamber whose wafer is to leave stage N first. After the (processed) wafer is moved from stage N to a loadlock, update the data structure and go to Step 1.

A flow diagram corresponding to the foregoing routine is described with respect to FIG. 5 below. If γ is no less than one, the robot will perform another wafer transfer only if it is not late to move W from B to A (provided it finds pair of chambers X and Y required in Step 6). If γ is less than one, being late in moving wafer W from B to its target chamber A is tolerated.

Figure 5:
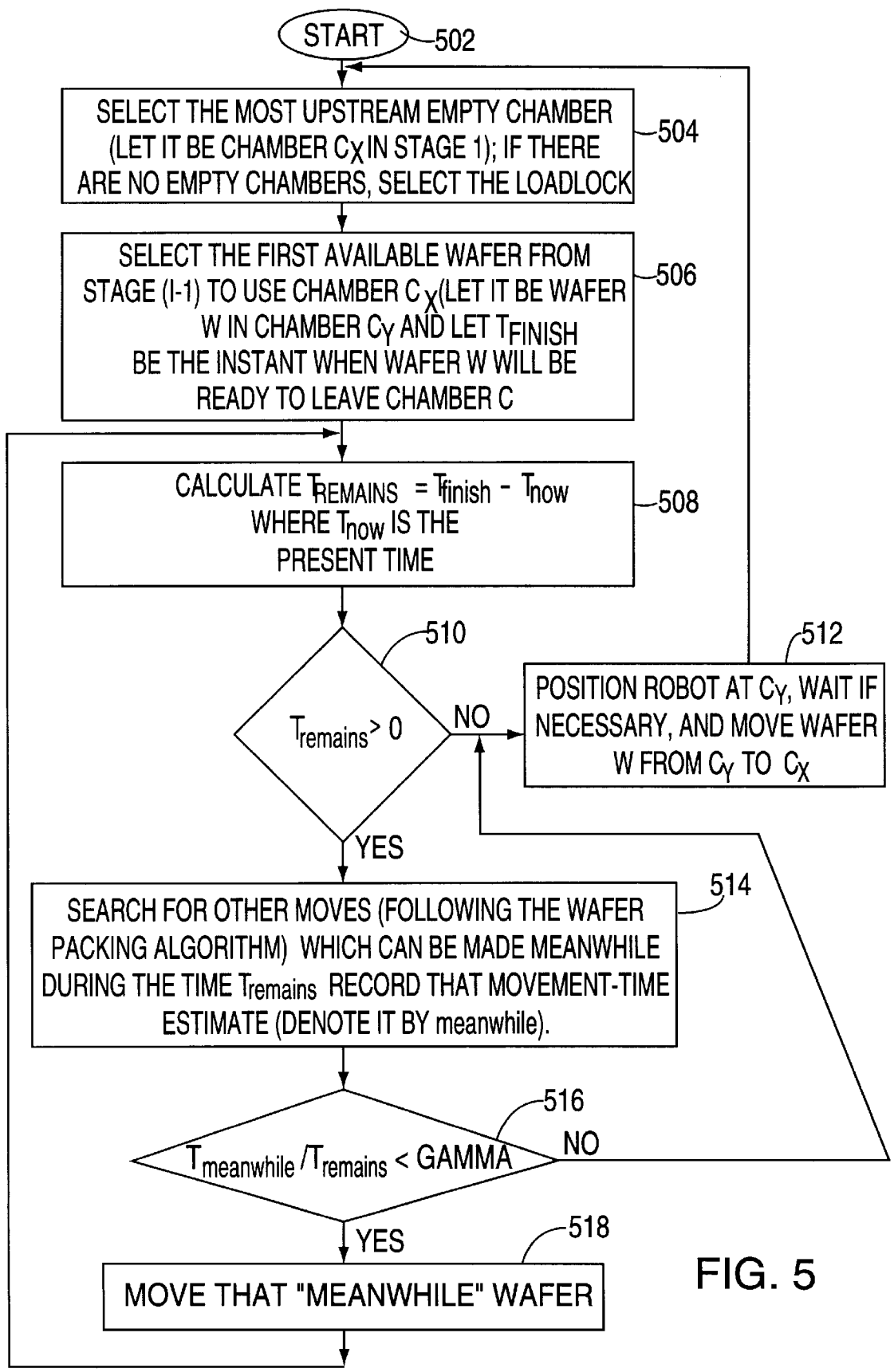
FIG. 5 depicts a flow diagram of a software implementation of a second embodiment of the invention.

FIG. 5 depicts a block diagram of an improved wafer packing routine known as the gamma (γ) tolerant wafer packing routine 500. This routine begins at step 502 and proceeds to step 504. At step 504, the routine selects the most upstream empty chamber (e.g., $C_x$). However, if there are no empty chambers, the routine selects the loadlock. At step 506, the routine selects the first available wafer at stage i−1 to use chamber $C_x$. Let wafer W in chamber $C_y$ be the first available wafer and let $T_{finish}$ be the instant in time when wafer W will be ready to leave chamber $C_y$. At step 508, the routine calculates the remaining time to complete the processing of wafer W. The remaining time being equivalent to the time when the wafer is expected to be complete minus the present time. This is denoted as $T_{remains}=T_{finish}-T_{now}$ where $T_{now}$ is the present time. At step 510, the routine queries whether $T_{remains}$ is greater than 0. If the query is answered negatively, the routine proceeds to step 512, wherein the robot is positioned at chamber $C_y$ to move the wafer W from $C_y$ to $C_x$. Since the remaining time is not greater than 0, the robot may wait a short period of time at chamber $C_y$ until the wafer is ready for transfer. Once the wafer is transferred, the routine returns to step 504 to select the next wafer to be transferred. If the query at step 510 is answered affirmatively, the routine proceeds to step 514. At step 514, the routine searches for other wafer transfers that can be completed within the time remaining before the transfer between chambers $C_y$ and $C_x$ must be completed. In other words, it looks for other transfers that can be made within the time $T_{remains}$. The time required to complete another move is denoted $T_{meanwhile}$. This time is computed by adding the robot's expected rotation time to the anticipated waiting time at the selected chamber before the process in that chamber is complete. In other words, $T_{meanwhile}$ equals $T_{robot}+T_{wait}$. Where $T_{robot}$ is the rotation time and $T_{wait}$ is the wait time at the new chamber. At step 516, $T_{meanwhile}$ is divided by $T_{remains}$ and compared to a threshold value γ. The division generates a quotient that is indicative of whether or not the robot has enough time to transfer another wafer before the wafer is available in chamber $C_y$. If the quotient is less than or equal to γ, the robot does not have enough time to make another transfer and, as such, it proceeds to step 512 where it completes the transfer from chamber $C_y$ to chamber $C_x$. However, if the quotient is greater than γ, the robot has time to accomplish another transfer while waiting for the wafer to be ready in chamber $C_y$, and, as such, the query at step 516 is answered affirmatively. Consequently, the routine proceeds from step 516 to step 518 wherein the other wafer is transferred. The routine then returns to step 508 to compute whether or not another transfer can be completed before the wafer in chamber $C_y$ is available for transfer. Typically, the value of γ is 1; thus, if the quotient is greater than 1, the robot will perform another wafer transfer. However, if the quotient is less than 1 being late in moving wafer W from chamber $C_y$ to chamber $C_x$ is tolerated because that delay will not adversely effect the throughput.

Apart from their inherent simplicity, low run time complexity, and ease of implementation, the significance of a priority based wafer packing routine comes from its smoothing effect on flow of wafers through the cluster tool. A visible bottleneck stage causes a convoy effect. For example, if S is the only visible bottleneck stage, a snapshot at a trace would likely show wafers in stages 1, 2, ..., S−1 ready to leave their respective chambers, while stages S+1, S+2, ..., N are likely to have empty chambers. Since the wafer packing routine starts with the highest priority (lowest stage number) empty chamber, it will most likely choose a chamber in stage S+1 thus clearing the bottleneck stage first. Consequently, wafer packing routines are adaptive in the sense that they tend to minimize the convoy effect resulting from a bottleneck stage.

III. Scheduling Based on Processing Times (SPT)

If chambers $C_1, C_2, \ldots, C_n$ all belong to the same stage S and $T_1, T_2, \ldots, T_n$ are the respective chamber processing times, the aggregate processing time $D_s$ of stage S is calculated as $$\frac{1}{D_s} = \frac{1}{T_1} + \frac{1}{T_2} + \ldots + \frac{1}{T_n}.$$

If at a given point in time, chamber $C_i$ is not available (say, because of a chamber cleaning function), that chamber's processing time is set to infinity and the above formula remains valid. A priority of stage k is assigned a positive integer $q_k$ such that the sequence $q_1, \ldots, q_n$ is related to the sequence of aggregate processing times $D_1, \ldots, D_n$ as follows: $q_i=q_j$, if $|D_i-D_j|\leq \Lambda$ and $q_i>q_j$, if $D_i>D_j+\Lambda$, where $\Lambda$ is a positive number. By varying $\Lambda$, the routine dynamically assigns priorities for a particular processing sequence. Due to chamber cleaning functions, these priorities are not fixed during operation of the tool. Thus, every time a chamber clean has been initiated or completed, priority must be recalculated.

If all chambers within a stage run the same process (which is the usual case), they all inherit the priority of their stage; else they are assigned different priorities within a stage based on their individual processing times (longer processing time means higher priority). A more precise definition of priorities based on stage processing times uses the numbers $D_i+e_i$ instead of $D_i$ alone, where $e_i$ is an aggregate exchange time for stage i (e.g., the time a robot needs to replace a wafer $W_i$ by its successor $W_{i+1}$ without any waiting due to processing).

A basic SPT routine operates as follows:

0. Recalculate the priorities and go to Step 1.
1. Scan all stages to find the highest priority stage which has empty chambers. If there is more than one stage with the same priority, pick the lowest stage number. If there are no stages with empty chambers, go to Step 2; else, go to Step 3.
2. Position the robot at a chamber whose wafer is to leave the stage N first. After the wafer is moved from stage N to a loadlock update the data structure and go to Step 1.
3. Let S be the stage chosen in Step 1 above and let A be the empty chamber in stage S which has the longest processing time (in case there is more than one empty chamber). Find and record A and go to Step 4.
4. Find the set of all active chambers in stage S−1 whose target chamber is A. Let wafer W in chamber B be the first one to leave the stage S−1. Position the robot at B, wait if necessary, and move W from chamber B into chamber A. Update the data structure and go to Step 0.

Figure 6:
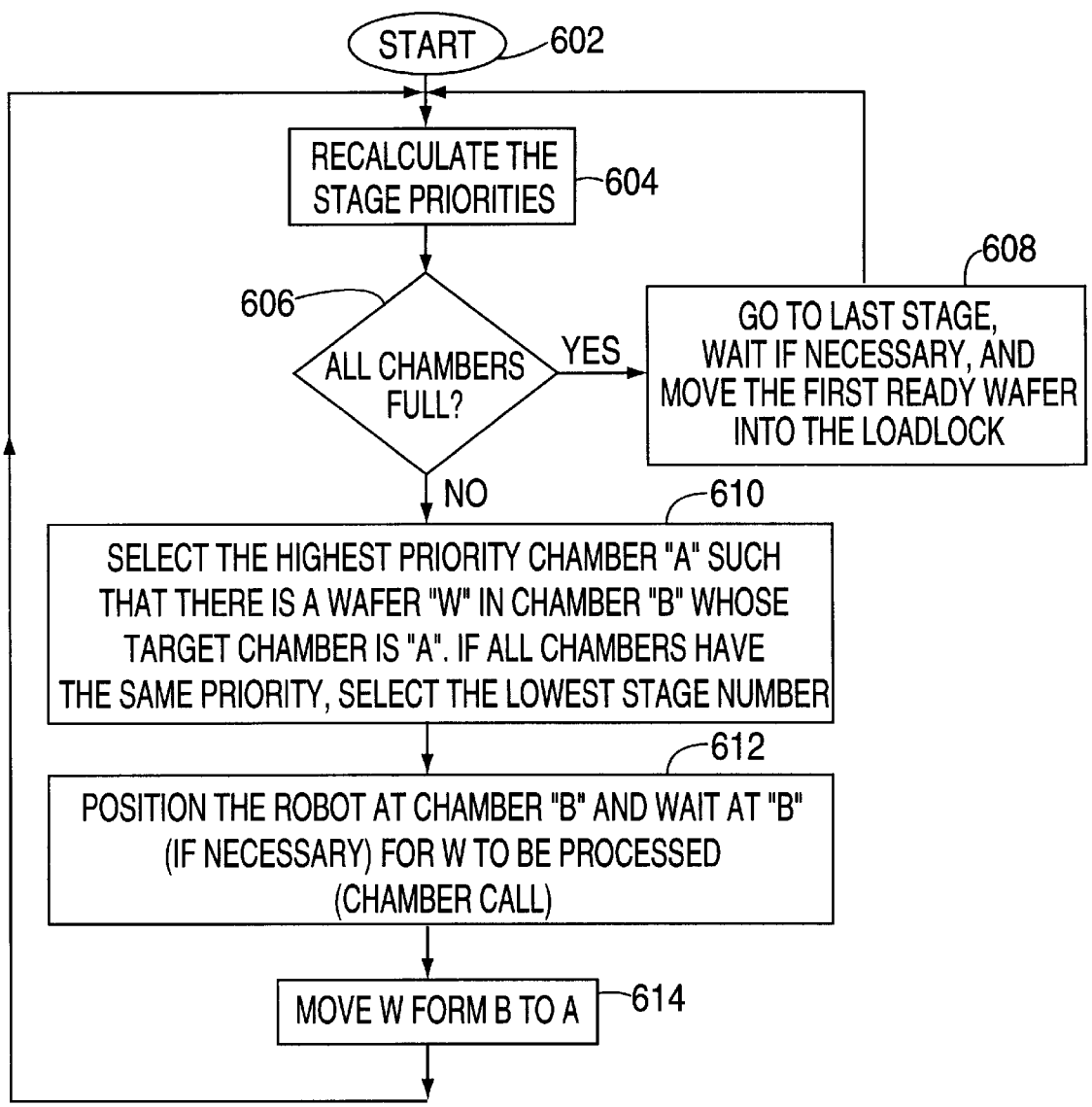
FIG. 6 depicts a flow diagram of a software implementation of a third embodiment of the invention.

FIG. 6 depicts a flow diagram of the third embodiment of the invention. The routine 600 starts at step 602 and proceeds to step 604. At step 604, the priorities for the stage are recalculated as described above. At step 606, the routine queries whether all the chambers are full. If all the chambers are full the routine proceeds to step 608 wherein the system places the robot at the last stage where the robot will wait, if necessary. The robot then moves the first ready wafer into the loadlock. The routine then returns to step 604, where the priorities are recalculated in view of any changes in the aggregate processing time. If the query at step 606 is negatively answered, the routine moves to step 610 where the process selects the highest priority chamber such that there is a wafer W in chamber $C_B$ whose target is chamber $C_A$. If all the chambers have the same priority, the routine selects the lowest stage number. At step 612, the robot is positioned at chamber $C_B$ to await the wafer W to be completely processed. At step 614, the robot moves wafer W from chamber $C_B$ to chamber $C_A$ and returns to step 604 where the priorities are once again recalculated for all the chambers within the stage. The new priorities are stored in the data structure for this trace, e.g., field 416 of FIG. 4.

Figure 7:
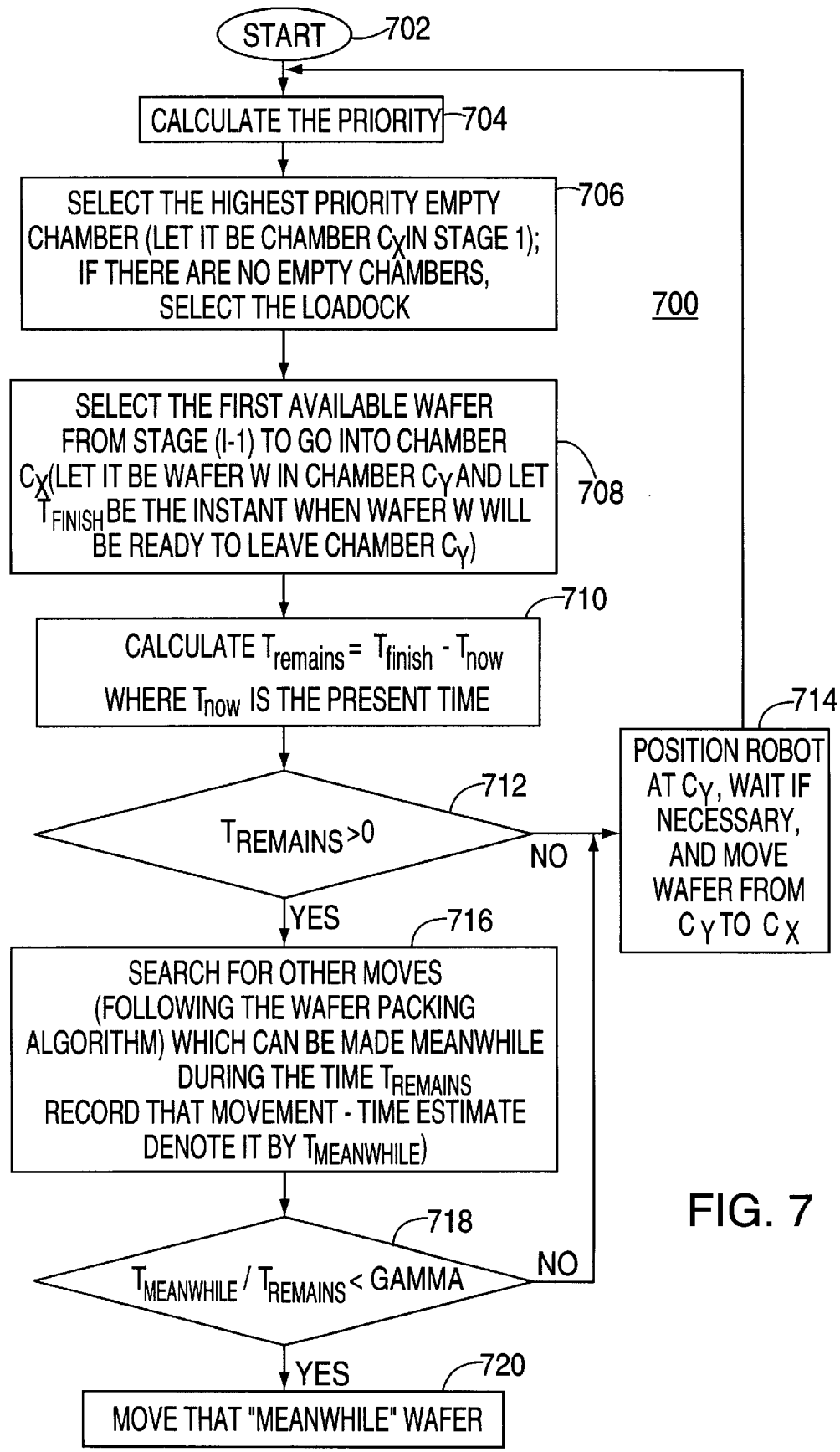
FIG. 7 depicts a flow diagram of a software implementation of a fourth embodiment of the invention.

FIG. 7 depicts a block diagram of a fourth embodiment of the invention which combines features of the γ tolerant scheduling routine (FIG. 5) with features of the dynamic prioritization scheduling routine (FIG. 6). The routine 700 of FIG. 7 begins at step 702 and proceeds to step 704. At step 704, the priority is calculated for each of the chambers. At step 706, the routine selects the highest priority empty chamber (e.g., chamber $C_x$). If there are no empty chambers, the routine selects the load lock. At step 708, the routine selects the first available wafer from stage i−1 to go into chamber $C_x$. The remaining steps of the routine (steps 710 through 720) function exactly as described in reference to FIG. 5 wherein steps 508 through 518 move various wafers within the cluster tool based on the assigned priorities and the gamma tolerance of particular wafer moves. As such, further discussion of FIG. 7 is not necessary and the reader should review the discussion of FIG. 5.

IV. Robot Bound Scheduling

A robot bound scheduling routine is intended for robot-bound mixed traces. The routine searches for candidate chambers $C_x$ and $C_y$ such that $C_x$ is an empty target chamber, $C_y$ contains a wafer W, and the time to move W from $C_y$ to $C_x$, $$T_{move} = T_{robot} + T_{wait},$$

is minimum. $T_{robot}$ is the time the robot needs to reach home position at $C_y$ from its current position plus the time to move wafer W from $C_y$ into its target chamber $C_x$ while $T_{wait}$ is the time robot needs to wait at $C_y$ for W to be ready to leave $C_y$. (For loadlock $T_{wait}$ is always zero). Clearly, it takes O(m) time to find the smallest value of $T_{move}$, where m is the number of chambers and O(m) is a well-known program complexity measure.

The robot bound scheduling routine has the following form:

1. Initialize: S←0 and $T_{move}$←∞ and newposition←none and target←none. Go to Step 2.
2. S←S+1. If S=N+2, go to Step 5; else, go to Step 3.
3. Scan stage S for empty chambers. If there are not empty chambers, go to Step 2; else, go to Step 4.
4. For each empty chamber in stage S calculate the time $T_{robot} + T_{wait}$. Let $f_s$ be the minimum value of $T_{robot} + T_{wait}$ in stage S attained for pair of chambers $C_x$ and $C_y$, where $C_x$ is in stage S and $C_y$ in stage S−1. If $f_s > T_{min}$, go to Step 2. Else, $T_{min}$←$f_s$ and newposition←$C_y$ and target←$C_x$ and go to Step 2.
5. Move robot to newposition chamber, wait if necessary, and move the wafer from newposition chamber into the target chamber. Update the data structure and go to Step 1.

Figure 8:
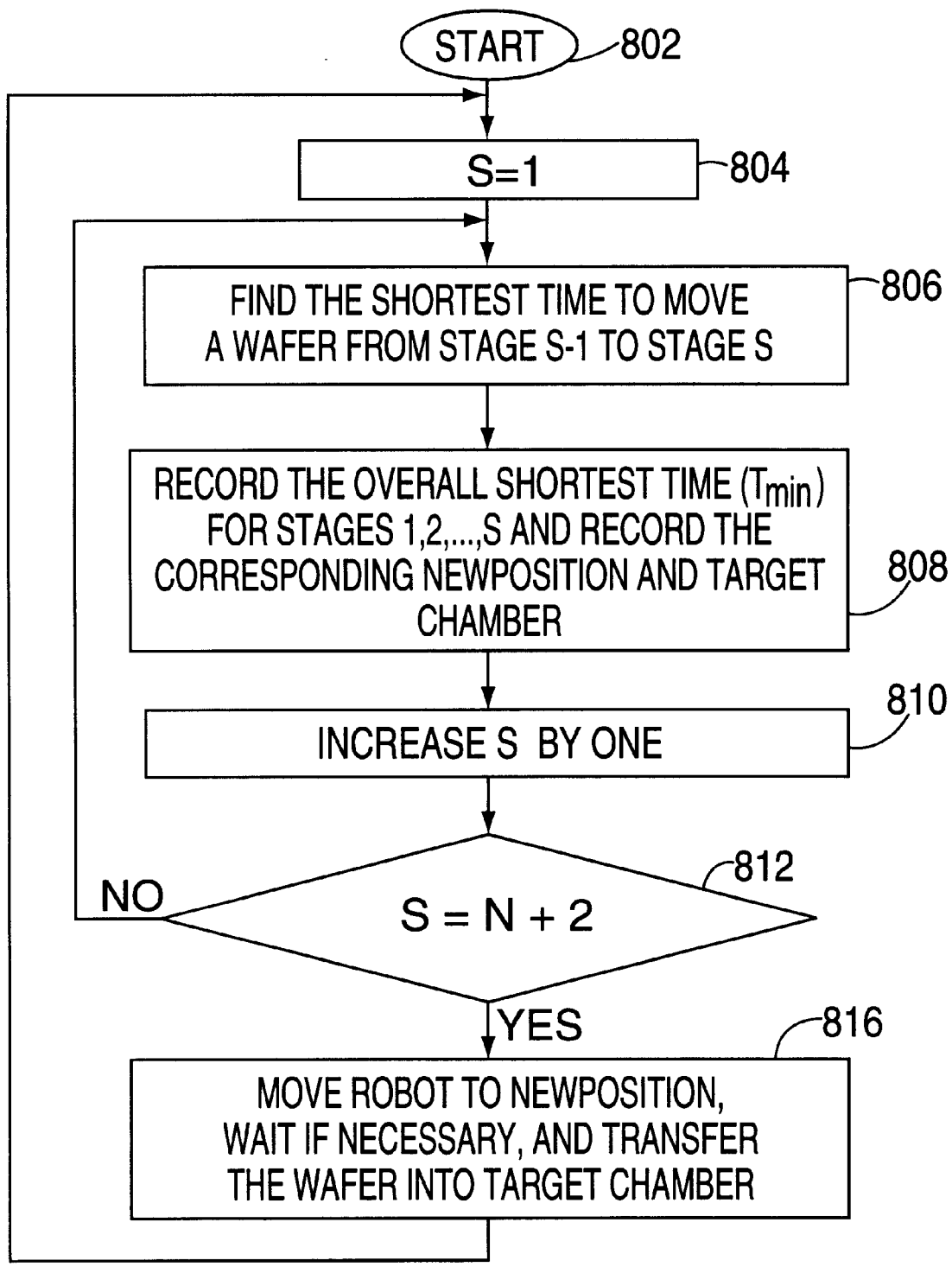
FIG. 8 depicts a flow diagram of a software implementation of a fifth embodiment of the invention.

The flow diagram representing an implementation of the robot bound scheduling routine in FIG. 8. There is an implicit search in Step 4 above. For each empty chamber in stage S, the value of $T_{move}$ is calculated for each nonempty chamber in stage S−1. Let Cs be an empty chamber in stage S and let $h_s$ be the minimum of all intervals $T_{min}$ for the chamber $C_s$ (there are at most $n_{s-1}$ values of $h_s$ where $n_s$ is the size of stage S). Then, $f_s$ in Step 4 is the smallest of all values of $h_s$ over all empty chambers in stage S.

Loadlock is both stage 0 and stage N+1. When it is treated as stage 0, there is always an available wafer to be removed. Since $T_{wait}$=0 for stage 0, loadlock is often a likely candidate for a newposition chamber. When loadlock is interpreted as stage N+1, there is always an empty place to put a wafer into it.

FIG. 8 depicts a flow diagram of the fourth embodiment of the invention. The routine 800 begins at step 802 and proceeds to step 804. At step 804, the stage number is set to 1, e.g., the first chamber after the loadlock. Note that the loadlock is both stage 0 and stage N+1. At step 806, the routine determines the shortest time to move a wafer from stage S−1 to stage S (e.g., compute $T_{move}$. At step 808, the routine records the overall shortest time ($T_{min}$) for stages 1, 2, . . . , S and records the corresponding new position and target chambers. At step 810, the stage number is increased by 1. At step 812, the routine queries whether the stage number is N+2. If the query is negatively answered, the routine returns along path 814 to step 806. If the query at step 812 is affirmatively answered, the routine proceeds to step 816. At step 816, the robot moves to a new position to await the wafer therein to be completely processed and then the robot transfers the wafer to the target chamber. The routine 800 then returns to step 804.

There is an implicit search in step 808 of the routine 800. For each empty chamber in stage S, the value of $T_{move}$ is calculated for each non-empty chamber in stage S−1. Let $C_s$ be an empty chamber in stage S and let $h_s$ be the minimum of all intervals $T_{min}$ for the chamber $C_s$ (there are at most $n_{s-1}$ values of $h_s$, where $n_s$ is the size of the stage S). Then, $f_s$, in step 808, is the smallest of all values of $h_s$ over all empty chambers in stage S.

The various embodiments of the present invention enable a wafer processing tool having multiple process chambers to have improved throughput over that of the prior art. Simulation data generated though modeling the Endura cluster tool manufactured by Applied Materials, Inc. and the various embodiments of the invention shows a 2.4 to 20 percent improvement in throughput as compared to simulation data for prior art scheduling routines.

Although various embodiments which incorporate the teachings of the present invention have been shown and described in detail herein, those skilled in the art can readily devise many other varied embodiments that still incorporate these teachings.

What is claimed is:

1. A method for scheduling semiconductor wafers for processing within a multiple chamber, semiconductor wafer processing system having a plurality of chambers, said method comprising:

assigning a priority to each chamber in said plurality of chambers;

selecting a chamber having a highest priority;

moving a wafer from a selected chamber to a target chamber in accordance with the assigned priority of the selected chamber.

2. The method of claim 1 wherein, if a plurality of chambers have the highest priority, the selecting step further comprises the step of selecting a chamber having a highest priority and having a shortest remaining process time.

3. The method of claim 1 further comprising the steps of:

determining a time to complete ($T_{remains}$) processing for the selected chamber;

computing a time to perform ($T_{meanwhile}$) a wafer move for at least one other chamber;

dividing $T_{meanwhile}$ by $T_{remains}$ to produce a quotient;

comparing the quotient to a threshold value;

if the quotient is less than the threshold value, then move the wafer in the selected chamber; and if the quotient is greater than the threshold value, then move a wafer in the other chamber.

4. The method of claim 1 further comprising the step of dynamically assigning priority to each chamber in response to processing times for each chamber.

5. The method of claim 4 further comprising the step of recalculating said priority after moving a wafer.

6. The method of claim 3 further comprising the step of dynamically assigning priority to each chamber in response to processing times for each chamber.

7. The method of claim 6 further comprising the step of recalculating said priority after moving a wafer.

8. The method of claim 1 wherein said assigning step further comprises assigning a highest priority to a chamber with a shortest time until a wafer therein is to be moved and a lowest priority to a chamber with a longest time until a wafer therein is to be moved.

9. Apparatus for scheduling semiconductor wafers for processing within a multiple chamber, semiconductor wafer processing system having a plurality of chambers, said apparatus comprising:

a sequencer for assigning a priority to each chamber in said plurality of chambers and for selecting a chamber having a highest priority; and a wafer transfer robot, coupled to said sequencer, for moving a wafer from a selected chamber to a target chamber in accordance with the assigned priority of the selected chamber.

10. The apparatus of claim 9 wherein, if a plurality of chambers have the highest priority, the sequencer selects a chamber having a highest priority and having a shortest remaining process time.

11. The apparatus of claim 9 wherein the sequencer further comprises:

means for determining a time to complete ($T_{remains}$) processing for the selected chamber;

means for computing a time to perform ($T_{meanwhile}$) a wafer move for at least one other chamber;

means for dividing $T_{meanwhile}$ by $T_{remains}$ to produce a quotient;

means for comparing the quotient to a threshold value;

where, if the quotient is less than the threshold value, then the wafer transfer robot moves the wafer in the selected chamber; and if the quotient is greater than the threshold value, then the wafer transfer robot moves a wafer in the other chamber.

12. The apparatus of claim 9 wherein the sequencer further comprises means for dynamically assigning priority to each chamber in response to processing times for each chamber.

13. The apparatus of claim 12 wherein the sequencer further comprises means for recalculating said priority after moving a wafer.

14. The apparatus of claim 11 wherein the sequencer further comprises means for dynamically assigning priority to each chamber in response to processing times for each chamber.

15. The apparatus of claim 14 wherein the sequencer further comprises means for recalculating said priority after moving a wafer.

16. The apparatus of claim 9 wherein said sequencer further comprises means for assigning a highest priority to a chamber with a shortest time until wafer therein is to be moved and a lowest priority to a chamber with a longest time until a wafer therein is to be moved.

17. A data structure stored in a computer memory, where said data structure is used by a sequencer to define a trajectory of one or more wafers through a cluster tool, comprising at least one field defining a priority of a chamber within said cluster tool.

18. The data structure of claim 17 further comprising a plurality of fields defining each stage of a trajectory.

* * * * *